(12) United States Patent
Homnick et al.

(10) Patent No.: US 12,384,807 B2
(45) Date of Patent: *Aug. 12, 2025

(54) FLUORINATED PHOTOINITIATORS AND FLUORINATED (CO)POLYMER LAYERS MADE USING THE SAME

(71) Applicant: 3M INNOVATIVE PROPERTIES COMPANY, St. Paul, MN (US)

(72) Inventors: Paul J. Homnick, Lake Elmo, MN (US); Thomas P. Klun, Lakeland, MN (US); Brandon R. Pietz, St. Paul, MN (US); Christopher S. Lyons, St. Paul, MN (US); Karl K. Stensvad, Eagan, MN (US); Kelly A. Volp, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 397 days.

This patent is subject to a terminal disclaimer.

(21) Appl. No.: 17/997,197

(22) PCT Filed: Apr. 27, 2021

(86) PCT No.: PCT/IB2021/053475
§ 371 (c)(1),
(2) Date: Oct. 26, 2022

(87) PCT Pub. No.: WO2021/229340
PCT Pub. Date: Nov. 18, 2021

(65) Prior Publication Data
US 2023/0174564 A1 Jun. 8, 2023

Related U.S. Application Data

(60) Provisional application No. 63/025,134, filed on May 14, 2020.

(51) Int. Cl.
*C07F 9/53* (2006.01)
*C08F 16/24* (2006.01)
(Continued)

(52) U.S. Cl.
CPC ............ *C07F 9/5337* (2013.01); *C08F 16/24* (2013.01); *C08F 20/10* (2013.01); *C08F 22/20* (2013.01);
(Continued)

(58) Field of Classification Search
None
See application file for complete search history.

(56) References Cited

U.S. PATENT DOCUMENTS

| 3,250,808 A | 5/1966 | Moore, Jr. et al. |
| 4,262,072 A | 4/1981 | Wendling et al. |

(Continued)

FOREIGN PATENT DOCUMENTS

| CN | 106117394 B | 6/2018 |
| JP | 3944957 B2 | 7/2007 |

(Continued)

OTHER PUBLICATIONS

Supplementary European Search Report for EP21804010.3, mailed on Apr. 10, 2024, 3 pages.

(Continued)

*Primary Examiner* — Ramsey Zacharia

(57) ABSTRACT

Fluorinated photoinitiators and polymerizable compositions including such fluorinated photoinitiators and at least one free-radically polymerizable monomer, oligomer, or mixture thereof. Multilayer films including a substrate and at least a first layer overlaying a surface of the substrate also are described, in which the at least first layer includes a (co)polymer obtained by polymerizing the foregoing polymerizable compositions. Processes for making a multilayer film (Continued)

using the polymerizable composition also are taught. Articles including the multilayer film also are disclosed, in which the article preferably is selected from a photovoltaic device, a display device, a solid-state lighting device, a sensor, a medical or biological diagnostic device, an electrochromic device, light control device, or a combination thereof.

20 Claims, 4 Drawing Sheets

(51) Int. Cl.
| | |
|---|---|
| *C08F 20/10* | (2006.01) |
| *C08F 22/20* | (2006.01) |
| *C09D 4/00* | (2006.01) |
| *C09D 5/00* | (2006.01) |
| *C09D 7/63* | (2018.01) |
| *C09D 129/10* | (2006.01) |
| *C09D 133/04* | (2006.01) |
| *C09D 135/02* | (2006.01) |

(52) U.S. Cl.
CPC ............... *C09D 4/00* (2013.01); *C09D 5/002* (2013.01); *C09D 7/63* (2018.01); *C09D 129/10* (2013.01); *C09D 133/04* (2013.01); *C09D 135/02* (2013.01)

(56) References Cited

U.S. PATENT DOCUMENTS

| | | | |
|---|---|---|---|
| 4,378,250 A | 3/1983 | Treadway et al. | |
| 4,696,719 A | 9/1987 | Bischoff | |
| 4,722,515 A | 2/1988 | Ham | |
| 4,842,893 A | 6/1989 | Yializis et al. | |
| 4,954,371 A | 9/1990 | Yializis | |
| 5,018,048 A | 5/1991 | Shaw et al. | |
| 5,032,461 A | 7/1991 | Shaw et al. | |
| 5,097,800 A | 3/1992 | Shaw et al. | |
| 5,125,138 A | 6/1992 | Shaw et al. | |
| 5,391,587 A | 2/1995 | Wu | |
| 5,440,446 A | 8/1995 | Shaw et al. | |
| 5,461,173 A | 10/1995 | Sato et al. | |
| 5,547,908 A | 8/1996 | Furuzawa et al. | |
| 5,811,183 A | 9/1998 | Shaw et al. | |
| 5,877,895 A | 3/1999 | Shaw et al. | |
| 5,945,174 A | 8/1999 | Shaw et al. | |
| 6,045,864 A | 4/2000 | Lyons et al. | |
| 6,172,810 B1 | 1/2001 | Fleming et al. | |
| 6,214,422 B1 | 4/2001 | Yializis | |
| 6,224,219 B1 | 5/2001 | Fleming et al. | |
| 6,231,939 B1 | 5/2001 | Shaw et al. | |
| 6,815,043 B2 | 11/2004 | Fleming et al. | |
| 6,838,183 B2 | 1/2005 | Yializis et al. | |
| 6,929,864 B2 | 8/2005 | Fleming et al. | |
| 7,018,713 B2 | 3/2006 | Padiyath et al. | |
| 7,215,473 B2 | 5/2007 | Fleming | |
| 7,335,786 B1 | 2/2008 | Iyer et al. | |
| 7,547,476 B2 | 6/2009 | Jones et al. | |
| 7,718,264 B2 | 5/2010 | Klun et al. | |
| 7,745,653 B2 | 6/2010 | Iyer et al. | |
| 7,825,272 B2 | 11/2010 | Iyer et al. | |
| 8,729,211 B2 | 5/2014 | Klun et al. | |
| 8,748,060 B2 | 6/2014 | Qiu | |
| 8,883,872 B2 | 11/2014 | Grützmacher et al. | |
| 9,587,127 B2 | 3/2017 | Herlihy et al. | |
| 9,718,896 B2 | 8/2017 | Hari et al. | |
| 9,718,961 B2 | 8/2017 | Corveleyn et al. | |
| 9,790,396 B2 | 10/2017 | Klun et al. | |
| 10,227,688 B2 | 3/2019 | Roehrig et al. | |
| 2004/0032658 A1 | 2/2004 | Fleming | |
| 2005/0182199 A1 | 8/2005 | Jing et al. | |
| 2006/0147177 A1 | 7/2006 | Jing et al. | |
| 2007/0286993 A1 | 12/2007 | Radcliffe et al. | |
| 2010/0129672 A1 | 5/2010 | Hao et al. | |
| 2010/0130687 A1 | 5/2010 | Tu | |
| 2010/0196704 A1* | 8/2010 | Suzuki ............... C08G 18/757 522/28 |
| 2011/0109966 A1 | 5/2011 | Yu et al. | |
| 2015/0248055 A1 | 9/2015 | Fall et al. | |
| 2015/0274889 A1 | 10/2015 | Sakoh et al. | |
| 2016/0306084 A1 | 10/2016 | Padiyath et al. | |
| 2018/0138433 A1 | 5/2018 | Klun et al. | |
| 2019/0144696 A1 | 5/2019 | Loccufier | |
| 2019/0233587 A1 | 8/2019 | Ishizeki et al. | |

FOREIGN PATENT DOCUMENTS

| | | |
|---|---|---|
| KR | 20100121283 A | 11/2010 |
| KR | 20100121284 A | 11/2010 |
| WO | 2000026973 A1 | 5/2000 |
| WO | 2003089239 A1 | 10/2003 |
| WO | 2004016689 A1 | 2/2004 |
| WO | 2005061638 A1 | 7/2005 |
| WO | 2005113642 A1 | 12/2005 |
| WO | 2006073785 A1 | 7/2006 |
| WO | 2006073918 A1 | 7/2006 |
| WO | 2006102383 A1 | 9/2006 |
| WO | 2008083304 A2 | 7/2008 |
| WO | 2011005443 A2 | 1/2011 |
| WO | 2011096371 A1 | 8/2011 |
| WO | 2012003198 A2 | 1/2012 |
| WO | 2012003416 A1 | 1/2012 |
| WO | 2012003417 A1 | 1/2012 |
| WO | 2012054685 A2 | 4/2012 |
| WO | 2012096899 A1 | 7/2012 |
| WO | 2012106184 A2 | 8/2012 |
| WO | 2014025384 A1 | 2/2014 |
| WO | 2014025385 A1 | 2/2014 |
| WO | 2014025387 A1 | 2/2014 |
| WO | 2014025570 A1 | 2/2014 |
| WO | 2014025983 A1 | 2/2014 |
| WO | 2016200972 A1 | 12/2016 |
| WO | 2017191043 A1 | 11/2017 |
| WO | 2020049378 A1 | 3/2020 |
| WO | 2020095258 A1 | 5/2020 |
| WO | 2020097319 A1 | 5/2020 |
| WO | 2021229331 A1 | 11/2021 |
| WO | 2021229338 A1 | 11/2021 |
| WO | 2021229340 A1 | 11/2021 |
| WO | 2021229348 A1 | 11/2021 |
| WO | 2021229547 A1 | 11/2021 |
| WO | 2021231068 A1 | 11/2021 |

OTHER PUBLICATIONS

Affinito, "Polymer-Oxide Transparent Barrier Layers", Society of Vacuum Coaters, 39th Annual Technical Conference Proceedings, 1996, pp. 392-397.
Affinito, "Vacuum Deposited Polymer/Metal Multilayer Films for Optical Application", Thin Solid Films, Dec. 1995, vol. 270, No. 1-2, pp. 43-48.
Dietlin, "Rational Design of Acyldiphenylphosphine Oxides as Photoinitiators of Radical Polymerization", Macromolecules, 2019, vol. 52, No. 20, pp. 7886-7893.
Hilfiker, "Spectroscopic Ellipsometry Characterization of Coatings on Biaxially Anisotropic Polymeric Substrates" Applied Surface Science, Nov. 2017, vol. 421, pp. 500-507.
Kemura, "UV-VIS Spectra and Photoinitiation Behaviors of Acylphosphine Oxide and Bisacylphosphine Oxide Derivatives in Unfilled, Light-Cured Dental Resins", Dental Materials Journal, 2008, vol. 27, No. 6, pp. 765-774.
International Search Report for PCT Application No. PCT/IB2021/053475, mailed on Aug. 26, 2021, 4 pages.
International Search Report for PCT Application No. PCT/IB2021/053542, mailed on Sep. 28, 2021, 5 pages.
International Search Report for PCT Application No. PCT/IB2021/054180, mailed on Oct. 19, 2021, 5 pages.

(56) References Cited

OTHER PUBLICATIONS

International Search Report for PCT Application No. PCT/IB2021/53473, mailed on Jul. 27, 2021, 3 pages.
Li, "Visible Photocatalysis of Novel Oxime Phosphonates: Synthesis of β-Aminophosphonates", Chemical Communications, 2019, vol. 55, No. 79, pp. 11888-11891.
Lindner, "Behavior of (Halogeno) Acylphosphines Towards Molecular Oxygen in Dependence of the Acyl Residue", Zeitschrift für Naturforschung B, 1978, pp. 849-854.
Roehrig, "Use of Evaporated Acrylate Coatings to Smooth the Surface of Polyester and Polypropylene Film Substrates", Journal of Plastic Film & Sheeting, Jul. 1997, vol. 13, pp. 235-251.
Samanta, "Organocatalytic Enantioselective Synthesis of Both Diastereomers of α-Hydroxyphosphinates", The Journal of Organic Chemistry, Jan. 2010, vol. 75, pp. 1101-1106.
Shaw, "A New High-Speed Process for Vapor Depositing Acrylate Thin Films: An Update", Society of Vacuum Coaters, 36th Annual Technical Conference Proceedings, 1993, pp. 348-351.
Shaw, "A New Vapor Deposition Process for Coating Paper and Polymer Webs", Technical Paper Presented at 6th International Vacuum Coating Conference, Oct. 1992, pp. 18-24.
Shaw, "Use of Vapor Deposited Acrylate Coatings to Improve the Barrier Properties of Metallized Film", Society of Vacuum Coaters, 37th Annual Technical Conference Proceedings, 1994, pp. 240-247.
Swanson, "Measurement of Web Curl", Presented in Applied Web Handling Conference Proceedings, 2006, 21 pages.
Zasukha, "Nucleophilic Fluorination of α-Aroylphosphinates with Morpholinosulfur Trifluoride", Heteroatom Chemistry, 2014, vol. 25, No. 4, pp. 256-264.

\* cited by examiner

FLUORINATED PHOTOINITIATORS AND FLUORINATED (CO)POLYMER LAYERS MADE USING THE SAME

CROSS REFERENCE TO RELATED APPLICATIONS

This application is a national stage filing under 35 U.S.C. 371 of PCT/IB2021/053475, filed Apr. 27, 2021, which claims the benefit of U.S. Provisional Patent Application No. 63/025,134, filed May 14, 2020, the disclosure of which is incorporated by reference in its/their entirety herein.

TECHNICAL FIELD

The present disclosure relates to fluorinated photoinitiators and methods of using fluorinated photoinitiators to form fluorinated (co)polymer layers in multilayer films and more particularly multilayer optical films.

BACKGROUND

Crosslinked (co)polymeric layers have been used in thin films for electrical, packaging and decorative applications. These layers can provide desired properties such as desired optical properties, mechanical strength, thermal resistance, chemical resistance, abrasion resistance, transparency, refractive index, and clarity. Multilayer optical films incorporating crosslinked (co)polymeric layers also are known.

Such multilayer films can be prepared using a variety of production methods. These methods include liquid coating techniques such as solution coating, roll coating, dip coating, spray coating, spin coating; and dry coating techniques such as Monomer Evaporation and Cure, Chemical Vapor Deposition (CVD), Plasma Enhanced Chemical Vapor Deposition (PECVD), initiated Chemical Vapor Deposition (iCVD), Plasma Polymerization, and Molecular Layer Deposition (MLD). One approach for producing multilayer optical films has been to produce inorganic optical layers, such as aluminum oxide, silicon oxide, titanium oxide or silicon nitride interspersed with (co)polymeric optical layers. The inorganic layers can be deposited using a variety of methods including CVD, PECVD, Atomic Layer Deposition (ALD), sputtering and vacuum processes for thermal or electron beam evaporation of solid materials.

Examples of such multilayer films and processes for forming such films can be found, for example, in U.S. Pat. No. 5,877,895 (Shaw, et al.); U.S. Pat. No. 6,815,043 (Fleming, et al.); U.S. Pat. No. 6,838,183 (Yializis); U.S. Pat. No. 6,929,864 (Fleming, et al.); U.S. Pat. No. 7,215,473 (Fleming); U.S. 2016/0306084 (Padiyath, et al.). These multilayer films have a number of applications in the display, optics, lighting, chemical sensor, biological sensor/diagnostic, and solar markets.

SUMMARY

This disclosure describes the synthesis of fluorinated photoinitiators used to produce fluorinated (co)polymers useful in multilayer film applications. These fluorinated photoinitiators are generally (1) soluble in and compatible with fluorinated monomers, oligomers, and polymers, (2) able to rapidly initiate free radical polymerization upon irradiation with actininc radiation such as ultraviolet or visible (UV-VIS) light, (3) also able to rapidly chemically bond to radical-polymerizable fluorinated monomers, oligomers, and (co)polymers (e.g., hexafluoro propylene oxide (HFPO)-diacrylate monomers, oligomers and (co)polymers) and (4) not known to cause a substantial increase in the low refractive index of the formed fluorinated (co)polymer layers. The combination of these properties makes these fluorinated photoinitiators useful for creating robust, chemically-bonded, fluorinated (co)polymer layers or films on surfaces where fluorinated materials are typically incompatible (e.g., inorganic layers such as silica).

Thus, in one aspect, the disclosure describes a fluorinated photoinitiator having the formula:

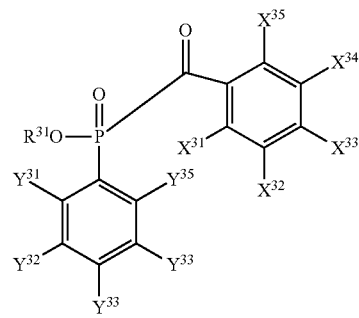

wherein:
$X^{31}$, $X^{32}$, $X^{33}$, $X^{34}$, $X^{35}$ are each independently selected from —H, —F, or —CF$_3$, with the proviso that at least 3 of $X^{31}$, $X^{32}$, $X^{33}$, $X^{34}$, $X^{35}$ are —F, or that at least 1 of $X^{31}$, $X^{32}$, $X^{33}$, $X^{34}$, $X^{35}$ is —CF$_3$;
$Y^{31}$, $Y^{32}$, $Y^{33}$, $Y^{34}$, $Y^{35}$ are each independently selected from —H, or CH$_3$; and
$R^{31}$ is an alkyl group of 1 to 4 carbon atoms.

In another aspect, the disclosure describes a polymerizable composition comprising the foregoing fluorinated photoinitiator and at least one free-radically polymerizable monomer, oligomer, or mixture thereof.

In yet another aspect, the disclosure describes a multilayer film comprising a substrate and at least a first layer overlaying a surface of the substrate, wherein the first layer comprises a (co)polymer obtained by polymerizing the foregoing polymerizable compositions.

In a further aspect, the disclosure describes an article comprising a multilayer film according to the foregoing embodiments, wherein the article is selected from a photovoltaic device, a display device, a solid-state lighting device, a sensor, a medical or biological diagnostic device, an electrochromic device, light control device, or a combination thereof.

In still another aspect, the disclosure describes a process for making a multilayer film, the process comprising forming at least one (co)polymer layer overlaying a substrate, wherein the (co)polymer layer comprises the reaction product of the foregoing polymerizable compositions, and applying at least one adhesion-promoting layer overlaying the substrate, optionally wherein the adhesion-promoting layer comprises an inorganic oxide, nitride, oxynitride, oxycarbide, hydroxylated (co)polymer, or a combination thereof.

Exemplary embodiments of the present disclosure provide multilayer films which exhibit improved moisture resistance when used in moisture barrier applications. Exemplary embodiments of the disclosure can enable the formation of multilayer films that exhibit superior mechanical properties such as elasticity and flexibility yet still have low oxygen or water vapor transmission rates. Exemplary embodiments of multilayer films according to the present disclosure are preferably transmissive to both visible and infrared light. Exemplary embodiments of multilayer films according to the present disclosure are also typically flexible. Exemplary embodiments of multilayer films according to the present disclosure generally do not exhibit delamination or curl that can arise from thermal stresses or shrinkage in a multilayer structure. The properties of exemplary embodiments of multilayer films disclosed herein typically are maintained even after high temperature and humidity aging.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

This disclosure describes the synthesis of fluorinated photoinitiators used to produce fluorinated (co)polymers useful in multilayer film applications. These fluorinated photoinitiators are generally (1) soluble in and compatible with fluorinated monomers, oligomers, and polymers, (2) able to rapidly initiate free radical polymerization upon irradiation with actininc radiation such as ultraviolet or visible (UV-VIS) light, (3) also able to rapidly chemically bond to radical-polymerizable fluorinated monomers, oligomers, and (co)polymers (e.g., hexafluoro propylene oxide (HFPO)-diacrylate monomers, oligomers and (co)polymers) and (4) not known to cause a substantial increase in the low refractive index of the formed fluorinated (co)polymer layers. The combination of these properties makes these fluorinated photoinitiators useful for creating robust, chemically-bonded, fluorinated (co)polymer layers or films on surfaces where fluorinated materials are typically incompatible (e.g., inorganic layers such as silica).

Thus, in one aspect, the disclosure describes a fluorinated photoinitiator having the formula:

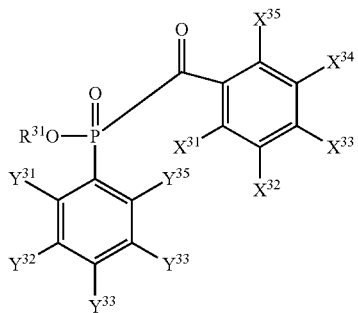

wherein:
$X^{31}$, $X^{32}$, $X^{33}$, $X^{34}$, $X^{35}$ are each independently selected from —H, —F, or —$CF_3$, with the proviso that at least 3 of $X^{31}$, $X^{32}$, $X^{33}$, $X^{34}$, $X^{35}$ are —F, or that at least 1 of $X^{31}$, $X^{32}$, $X^{33}$, $X^{34}$, $X^{35}$ is —$CF_3$;
$Y^{31}$, $Y^{32}$, $Y^{33}$, $Y^{34}$, $Y^{35}$ are each independently selected from —H, or $CH_3$; and
$R^{31}$ is an alkyl group of 1 to 4 carbon atoms.

In another aspect, the disclosure describes a polymerizable composition comprising the foregoing fluorinated photoinitiator and at least one free-radically polymerizable monomer, oligomer, or mixture thereof.

In yet another aspect, the disclosure describes a multilayer film comprising a substrate and at least a first layer overlaying a surface of the substrate, wherein the first layer comprises a (co)polymer obtained by polymerizing the foregoing polymerizable compositions.

In a further aspect, the disclosure describes an article comprising a multilayer film according to the foregoing embodiments, wherein the article is selected from a photovoltaic device, a display device, a solid-state lighting device, a sensor, a medical or biological diagnostic device, an electrochromic device, light control device, or a combination thereof.

In still another aspect, the disclosure describes a process for making a multilayer film, the process comprising forming at least one (co)polymer layer overlaying a substrate, wherein the (co)polymer layer comprises the reaction product of the foregoing polymerizable compositions, and applying at least one adhesion-promoting layer overlaying the substrate, optionally wherein the adhesion-promoting layer comprises an inorganic oxide, nitride, oxynitride, oxycarbide, hydroxylated (co)polymer, or a combination thereof.

Exemplary embodiments of the present disclosure provide multilayer films which exhibit improved moisture resistance when used in moisture barrier applications. Exemplary embodiments of the disclosure can enable the formation of multilayer films that exhibit superior mechanical properties such as elasticity and flexibility yet still have low oxygen or water vapor transmission rates. Exemplary embodiments of multilayer films according to the present disclosure are preferably transmissive to both visible and infrared light. Exemplary embodiments of multilayer films according to the present disclosure are also typically flexible. Exemplary embodiments of multilayer films according to the present disclosure generally do not exhibit delamination or curl that can arise from thermal stresses or shrinkage in a multilayer structure. The properties of exemplary embodiments of multilayer films disclosed herein typically are maintained even after high temperature and humidity aging.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The accompanying drawings are incorporated in and constitute a part of this specification and, together with the description, explain the advantages and principles of exemplary embodiments of the present disclosure.

Like reference numerals in the drawings indicate like elements. The drawings herein are not drawn to scale, and in the drawings, the illustrated elements are sized to emphasize selected features.

DETAILED DESCRIPTION

Glossary

Figure 1:
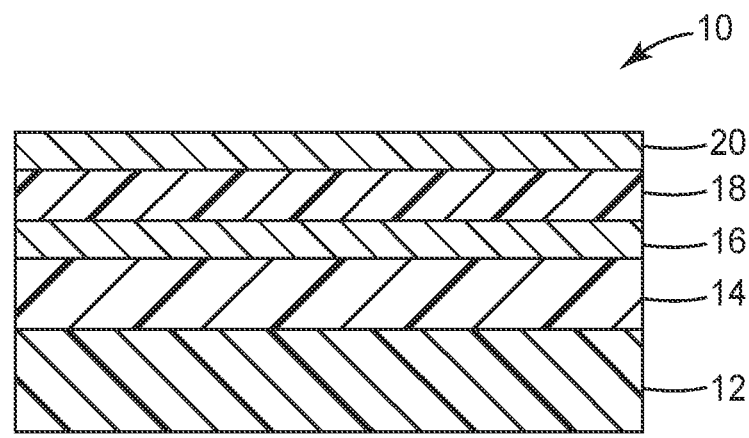
FIG. 1 is a diagram illustrating an exemplary multilayer film incorporating a (co)polymer layer formed using a fluorinated photoinitiator according to an exemplary embodiment of the present disclosure.

Certain terms are used throughout the description and the claims that, while for the most part are well known, may require some explanation. It should understood that, as used herein, By using the terms "overcoated," "overlay" and "overlaying" to describe the position of a layer with respect to a substrate or other layer of a multilayer film of the present disclosure, we refer to the layer as being atop the substrate or other layer, but not necessarily adjoining or contiguous with the substrate or layer.

By using the term "separated by" to describe the position of a layer with respect to one or more other layers, we refer to the other layers as being between the layer and the substrate or another different layer, but not necessarily but not necessarily adjoining or contiguous with the substrate or different layer.

The terms "(co)polymer" and "polymer" include homopolymers and copolymers, such as homopolymers or copolymers that may be formed in a miscible blend, e.g., by coextrusion or by reaction, including, e.g., transesterification. The term "copolymer" includes both random and block copolymers.

The term "coupling agent" means a compound which provides a chemical bond between two dissimilar materials, usually an inorganic and an organic material. Coupling agents are typically multi-functional molecules or oligomers which can act to effect crosslinking during chemical reactions, for example, a chemical reaction such as free radical polymerization to form a (co)polymer.

The term "film" or "layer" refers to a single stratum within a multilayer film.

The term "(meth)acryl" or "(meth)acrylate" with respect to a monomer, oligomer, (co)polymer or compound means a vinyl-functional alkyl ester formed as the reaction product of an alcohol with an acrylic or a methacrylic acid.

The term "crosslinked" (co)polymer refers to a (co) polymer whose (co)polymer chains are joined together by covalent chemical bonds, usually via crosslinking molecules or groups, to form a network (co)polymer. A crosslinked (co)polymer is generally characterized by insolubility but may be swellable in the presence of an appropriate solvent.

The term "cure" refers to a process that causes a chemical change, e.g., a reaction that creates a covalent bond to solidify a layer or increase its viscosity.

The term "cured (co)polymer" includes both crosslinked and uncrosslinked polymers.

The term "low refractive index" means a material or layer having a refractive index from 1.3 to 1.5.

The term "high refractive index" means a material or layer having a refractive index from 1.5-2.5.

The term "metal" includes a pure metal or a metal alloy.

The term "photoinitiator" means a material and more particularly a molecule that creates reactive species (e.g., free radicals, cations or anions) when exposed to actinic radiation (e.g., ultraviolet (UV), visible (VIS) or infrared (IR) light).

The term "vapor coating" or "vapor depositing" means applying a coating to a substrate surface from a vapor phase, for example, by evaporating and subsequently depositing onto the substrate surface a precursor material to the coating or the coating material itself. Exemplary vapor coating processes include, for example, physical vapor deposition (PVD), chemical vapor deposition (CVD), and combinations thereof.

By using the term "visible light-transmissive" with respect to a support, layer, assembly, article or device, we mean that the support, layer, assembly or device has an average transmission over the visible portion of the spectrum, $T_{vis}$, of at least about 20%, measured along the normal axis.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Flexible layers in multilayer films are desirable for electronic and/or optical devices where flexibility and durability are required. A flexible multilayer film may provide advantages over glass as it is flexible, light-weight, durable, and enables low cost continuous roll-to-roll processing.

Although various photoinitiators are known and commercially-available, it is desirable and would be advantageous to provide a fluorinated photoinitiator that can readily react with other fluorinated monomers or oligomers to form fluorinated (co)polymer that do not adversely affect interlayer adhesion of fluorinated (co)polymer layers in multilayer films.

Fluorinated Photoinitiators

In exemplary embodiments, the disclosure describes fluorinated photoinitiators having the following formula:

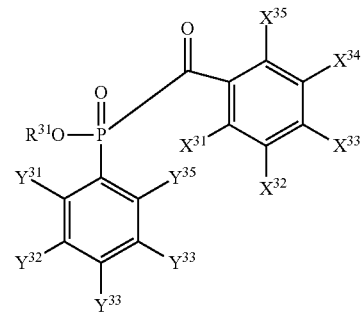

wherein:
$X^{31}$, $X^{32}$, $X^{33}$, $X^{34}$, $X^{35}$ are each independently selected from —H, —F, or —CF$_3$, with the proviso that at least 3 of $X^{31}$, $X^{32}$, $X^{33}$, $X^{34}$, $X^{35}$ are —F, or that at least 1 of $X^{31}$, $X^{32}$, $X^{33}$, $X^{34}$, $X^{35}$ is —CF$_3$;
$Y^{31}$, $Y^{32}$, $Y^{33}$, $Y^{34}$, $Y^{35}$ are each independently selected from —H, or CH$_3$; and
$R^{31}$ is an alkyl group of 1 to 4 carbon atoms.

In some exemplary embodiments, the fluorinated photoinitiator has a calculated number average molecular weight of no greater than 700, 600, 500, or 400 g/mole. In some exemplary embodiments, the fluorinated photoinitiator has a fluorine content of at least 10, 15, 20, 25, 30, 35, 40, or 50 wt. %.

Polymerizable Compositions

In further exemplary embodiments, the disclosure describes a polymerizable composition comprising at least one of the foregoing fluorinated photoinitiators and at least one free-radically polymerizable monomer, oligomer, or mixture thereof.

In some exemplary embodiments, the polymerizable composition is comprised of the fluorinated photoinitiator in an amount of at least 0.1, 0.5, 1.0, 1.5, 2.0, 2.5, 3.0, 3.5, or 4.0 wt. % based on the weight of the polymerizable composition. In certain such exemplary embodiments, the polymerizable composition is comprised of the fluorinated photoinitiator in an amount of no more than about 10.0, 7.5, 5.0, 4.0 or 3.0 wt. % based on the weight of the polymerizable composition.

In certain of the foregoing embodiments, the free-radically polymerizable monomer, oligomer, or combination thereof is fluorinated. Preferably, the free-radically polymerizable monomer, oligomer, or combination thereof has a fluorine content of at least 25, 30 or 35 wt. %. In some of the foregoing embodiments, the polymerizable composition is comprised of a fluorinated oligomer including a perfluorooxyalkylene or a perfluorooxyalkyl group.

In some of the foregoing embodiments, the polymerizable composition comprises at least one of a (meth)acrylic monomer or oligomer, optionally wherein the at least one (meth)acrylic monomer or oligomer comprises the HFPO oligomer diacrylate described below.

Multilayer Films Including at Least One Fluorinated (Co) polymer Layer

Turning to the drawings, FIG. 1 is a diagram of a multilayer film 10 having a moisture resistant coating comprising a single dyad. Film 10 includes layers arranged in the following order: a substrate 12; an adhesion-promoting layer 14; an at least one fluorinated (co)polymer layer 16; an optional adhesion-promoting layer 18; and an optional fluorinated (co)polymer layer 20. Adhesion-promoting layer 14 and fluorinated (co)polymer layer 16 together form a dyad. Some embodiments include one dyad, other embodiments include two dyads as shown, and film 10 can include additional dyads of alternating adhesion-promoting layer 18 and fluorinated (co)polymer layer 20 between substrate 10 and the uppermost dyad.

The polymerizable composition may be co-deposited or sequentially deposited to form fluorinated (co)polymer layer 16, which in some exemplary embodiments, improves the moisture resistance of film 10 and the peel strength and/or adhesion of fluorinated (co)polymer layer 18 to an adjoining adhesion-promoting layer, leading to improved interlayer adhesion and advantageous delamination resistance within the multilayer film as explained further below. Presently preferred materials for use in the multilayer film 10 are also identified further below, and in the Examples.

Thus, in further exemplary embodiments, the disclosure describes at least one a multilayer film comprising a substrate and at least a first layer overlaying a surface of the substrate, the first layer comprising a (co)polymer obtained by polymerizing at least one of the foregoing polymerizable compositions including at least one of the foregoing fluorinated photoinitiators.

In further exemplary embodiments, the multilayer film further comprises at least one additional layer adjoining the first layer. In some exemplary embodiments, the multilayer film further comprises a plurality of alternating layers comprised of an adhesion-promoting layer overlaying the substrate and comprising an inorganic oxide, nitride, oxynitride, oxycarbide; a metal or metal alloy; a (co)polymer, or a combination thereof; and an adjoining (co)polymer layer overlaying the substrate and comprising a (co)polymer.

In certain exemplary embodiments, the multilayer article comprises a plurality of alternating layers of the adhesion-promoting layer and the fluorinated (co)polymer layer on the at least one fluorinated (co)polymer layer. The adhesion-promoting layer and fluorinated (co)polymer layer together form a "dyad", and in one exemplary embodiment, the multilayer film can include more than one dyad, forming a multilayer film. Each of the adhesion-promoting layers and/or fluorinated (co)polymer layers in the multilayer film (i.e. including more than one dyad) can be the same or different. An optional inorganic layer, which preferably is an adhesion-promoting layer, can be applied over the plurality of alternating layers or dyads.

Substrates

Substrate 12 can be a flexible, visible light-transmissive substrate, such as a flexible light transmissive polymeric film. In one presently preferred exemplary embodiment, the substrates are substantially transparent, and can have a visible light transmission of at least about 50%, 60%, 70%, 80%, 90% or even up to about 100% at 550 nm.

Exemplary flexible light-transmissive substrates include thermoplastic polymeric films including, for example, polyesters, poly(meth)acrylates (e.g., polymethyl meth(meth) acrylate), polycarbonates, polypropylenes, high or low density polyethylenes, polysulfones, polyether sulfones, polyurethanes, polyamides, polyvinyl butyral, polyvinyl chloride, fluoropolymers (e.g., polyvinylidene difluoride, ethylenetetrafluoroethylene (ETFE) (co)polymers, terafluoroethylene (co)polymers, hexafluoropropylene (co)polymers, polytetrafluoroethylene, and copolymers thereof), polyethylene sulfide, cyclic olefin (co)polymers, and thermoset films such as epoxies, cellulose derivatives, polyimide, polyimide benzoxazole and polybenzoxazole.

Thus, in some exemplary embodiments, the substrate comprises a flexible transparent (co)polymeric film selected from or comprising polyethylene terephthalate (PET), polyethylene terephthalate glycol (PETg), polyethylene napthalate (PEN), heat stabilized PET, heat stabilized PEN, polyoxymethylene, polyvinylnaphthalene, polyetheretherketone, a fluoropolymer, polycarbonate, polymethylmeth(meth) acrylate, poly α-methyl styrene, polysulfone, polyphenylene oxide, polyetherimide, polyethersulfone, polyamideimide, polyimide, polyphthalamide, cyclic olefin polymer (COP), cyclic olefin copolymer (COC), triacetate cellulose (TAC), or combinations thereof.

Presently preferred (co)polymeric substrate films comprise polyethylene terephthalate (PET), polyethylene napthalate (PEN), heat stabilized PET, heat stabilized PEN, polyoxymethylene, polyvinylnaphthalene, polyetheretherketone, fluoropolymer, polycarbonate, polymethylmeth (meth)acrylate, poly α-methyl styrene, polysulfone, polyphenylene oxide, polyetherimide, polyethersulfone, polyamideimide, polyimide, polyphthalamide, or combinations thereof.

In some presently-preferred exemplary embodiments, the substrate can be a multilayer optical film ("MOF"), such as those described in U.S. Patent Application Publication No.

US 2004/0032658 A1. In one presently-preferred exemplary embodiment, the substrate is a PET substrate.

The substrate may have a variety of thicknesses, e.g., about 0.01 to about 1 mm. The substrate may however be considerably thicker, for example, when a self-supporting article is desired. Such articles can conveniently also be made by laminating or otherwise joining a disclosed film made using a flexible substrate to a thicker, inflexible or less flexible supplemental support.

The substrate may be advantageously selected to be a (co)polymeric film that is heat-stabilized, e.g., using heat setting, annealing under tension, or other techniques that will prevent or limit shrinkage up to at least the heat stabilization temperature when the (co)polymeric film is not constrained.

Fluorinated (Co)Polymer Layer(s)

Returning to FIG. 1, the at least one fluorinated (co) polymer layer 16 can include any fluorinated (co)polymer, but necessarily includes at least one fluorinated (co)polymer derived from any of the foregoing polymerizable compositions including at least one fluorinated photoinitiator.

For example, the at least one fluorinated (co)polymer layer 16 can be formed by applying a layer of any of the foregoing polymerizable compositions to the substrate and curing or crosslinking the layer to form the fluorinated (co)polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the substrate.

The polymerizable composition also can be applied to the substrate 12 using conventional coating methods such as roll coating (e.g., gravure roll coating) or spray coating (e.g., electrostatic spray coating), then crosslinked as set out above. The at least one fluorinated (co)polymer layer 16 can also be formed by applying a layer containing the polymerizable composition dissolved or dispersed in a solvent or other liquid medium, and drying the thus-applied layer to remove the solvent.

Chemical Vapor Deposition (CVD), Plasma Enhanced Chemical Vapor Deposition (PECVD), initiated Chemical Vapor Deposition (iCVD), Plasma Polymerization, and Molecular Layer Deposition (MLD) may also be employed to apply the polymerizable composition as a layer overlaying the substrate and curing or crosslinking the layer, as described further below.

Preferably, the at least one fluorinated (co)polymer layer 16 is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461(Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al. and U.S. Pat. No. 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum Deposited Polymer/Metal Multilayer Films for Optical Application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Layers", Society of Vacuum Coaters 39th Annual Technical Conference Proceedings (1996).

In some exemplary embodiments, the smoothness and continuity of the at least one fluorinated (co)polymer layer 16 (and optionally also each adhesion-promoting layer 14 and fluorinated (co)polymer layer 20) and its adhesion to the underlying substrate or layer may be enhanced by appropriate pretreatment. Examples of a suitable pretreatment regimen include an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric (or inorganic) layer. Plasma pretreatment can be particularly useful.

In some exemplary embodiments, a separate adhesion promotion layer which may have a different composition than the at least one fluorinated (co)polymer layer 16 may also be used atop the substrate or an underlying layer to improve adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the at least one fluorinated (co)polymer layer will depend in part on the nature and surface topography of the substrate and the adhesion-promoting layer. The thickness preferably is sufficient to provide a smooth, defect-free surface to which the subsequent adhesion-promoting layer can be applied. For example, the at least one fluorinated (co)polymer layer may have a thickness of a few nm (e.g., 2 or 3 nm) to about 5 micrometers, and can be thicker if desired.

Free-Radical Polymerizable Oligomers

Returning to FIG. 1, in one aspect, for example, the at least one fluorinated (co)polymer layer 16 can be formed from various precursors, for example, fluorinated and/or non-fluorinated (meth)acrylate monomers and/or oligomers that include isobornyl (meth)acrylate, dipentaerythritol penta(meth)acrylates, epoxy (meth)acrylates, epoxy (meth)acrylates blended with styrene, di-trimethylolpropane tetra (meth)acrylates, diethylene glycol di(meth)acrylates, 1,3-butylene glycol di(meth)acrylate, penta(meth)acrylate esters, pentaerythritol tetra(meth)acrylates, pentaerythritol tri(meth)acrylates, ethoxylated (3) trimethylolpropane tri (meth)acrylates, ethoxylated (3) trimethylolpropane tri (meth)acrylates, alkoxylated trifunctional (meth)acrylate esters, dipropylene glycol di(meth)acrylates, neopentyl glycol di(meth)acrylates, ethoxylated (4) bisphenol A dimeth (meth)acrylates, tricyclodecanedimethanol di(meth)acrylates, cyclohexane dimethanol di(meth)acrylate esters, isobornyl meth(meth)acrylate, cyclic di(meth)acrylates and tris(2-hydroxy ethyl) isocyanurate tri(meth)acrylate, and urethane (meth)acrylates. Such compounds are widely available from vendors such as, for example, Sartomer Company, Exton, Pennsylvania; UCB Chemicals Corporation, Smyrna, Georgia; and Aldrich Chemical Company, Milwaukee, Wisconsin, or can be prepared by standard methods. Additional useful (meth)acrylate materials include dihydroxyhydantoin moiety-containing poly(meth)acrylates, for example, as described in U.S. Pat. No. 4,262,072 (Wendling et al.). Preferably, the at least one fluorinated (co)polymer layer precursor comprises a fluorinated or non-fluorinated (meth) acrylate monomer.

Fluorinated Monomers

In some embodiments, the (meth)acrylate monomers and/or oligomers include highly fluorinated monomers. Perfluorooxyalkyl and perfluoroxyalkylene compounds can be obtained by oligomerization of hexafluoropropylene oxide that result in terminal carbonyl fluoride group(s). This carbonyl fluoride(s) may be converted to an ester by reactions known to those skilled in the art. Preparation of perfluorinated methyl ester compounds are described, for example, in U.S. Pat. Nos. 3,250,808 and 9,718,896. Preparation of perfluorooxyalkyl and perfluoroxyalkylene compounds comprising (meth)acryl groups is also known. See for example, U.S. Pat. No. 9,718,896. Examples include di(meth)acrylates including hexafluoropropylene oxide oligomer (HFPO) moieties. In certain such exemplary embodiments, the free-radically polymerizable monomer, oligomer, or combination thereof has a fluorine content of at least 25, 30 or 35 wt. %. In some of the foregoing embodiments, the polymerizable composition comprises at least of a (meth) acrylic monomer or oligomer, optionally wherein the at least one (meth)acrylic monomer or oligomer comprises the HFPO oligomer diacrylate described below of the structure:
$CH_2=CHC(O)O-H_2C-(CF_3)CF-[OCF_2(CF_3)CF]_s-O(CF_2)_uO-[CF(CF_3)CF_2O]_t-CF(CF_3)-CH_2-OC(O)CH=CH_2$, having, for example, a number average molecular weight of about 2000 g/mole, prepared according to the synthetic method generally described in U.S. Pat. No. 9,718,961 (PFE-3). Here HFPO refers to the perfluorooxyalkylene group "—HFPO—" which is $-(CF_3)CF-[OCF_2(CF_3)CF]_s-O(CF_2)_uO-[CF(CF_3)CF_2O]_t-CF(CF_3)-$, wherein u is from 2 to 6 and s and t are independently integers of 2 to 25. In some embodiments p is 3 or 4. In some embodiments, the sum of s and t is at least 3, 4, 5, 6, 7, 8, 9, or 10. In some embodiments, the sum of s and t is no greater than 24, 23, 22, 21, 20, 19, 18, 17, 16, 15, 14, 13, 12, 11, or 10. Divalent —HFPO— generally also exists as a distribution or mixture of molecules with a range of values for s and t. Thus, s and t may be expressed as an average value. Such average value is typically not an integer.

Adhesion-Promoting Layers

The multilayer film may include an adhesion-promoting layer deposited overlaying or in some embodiments, directly on a substrate that optionally includes an electronic or optical device, a process often referred to as direct encapsulation. The electronic or optical device can be, for example, an organic, inorganic, or hybrid organic/inorganic semiconductor device including, for example, a photovoltaic device such as a copper indium gallium di-selenide (CIGS) photovoltaic device; a display device such as an organic light emitting diode (OLED), electrochromic, or an electrophoretic display; an OLED or other electroluminescent solid state lighting device, or others.

Flexible electronic devices can be encapsulated directly with the gradient composition adhesion-promoting layer. For example, the devices can be attached to a flexible carrier substrate, and a mask can be deposited to protect electrical connections from the adhesion-promoting layer deposition. The at least one fluorinated (co)polymer layer 16, the adhesion-promoting layer 14, and the optional adhesion-promoting layer 18 and the optional and the fluorinated (co)polymer layer 20 can be deposited as described further below, and the mask can then be removed, exposing the electrical connections.

In some exemplary embodiments, the adhesion-promoting layer comprises at least one of an oxide, nitride, carbide, boride or a combination thereof of atomic elements selected from Groups IIA, IIIA, IVA, IVB, VA, VB, VIA, VIIA, IB, or IIB; a metal or a combination thereof selected from Groups IIIA, IIIB, IVA, IVB, VB, VIB, VIIIB; a rare-earth metal or a combination thereof; or a (meth)acrylic (co) polymer or a combination thereof.

In some presently-preferred embodiments, the oxide, nitride, carbide or boride comprises aluminum, indium, silicon, tin, titanium, zirconium, hafnium, vanadium, niobium, tantalum, cerium, strontium, or a combination thereof and the metal or metal alloy comprises aluminum, silicon, germanium, copper, silver, gold, titanium, zirconium, chromium, nickel or a combination thereof.

In some particular exemplary embodiments, an inorganic layer, more preferably an inorganic adhesion-promoting layer, may be applied to the uppermost fluorinated (co) polymer layer. Preferably, the adhesion-promoting layer comprises silicon aluminum oxide or indium tin oxide.

In some exemplary embodiments, the composition of the adhesion-promoting layer may change in the thickness direction of the layer, i.e. a gradient composition. In such exemplary embodiments, the adhesion-promoting layer preferably includes at least two inorganic materials, and the ratio of the two inorganic materials changes throughout the thickness of the adhesion-promoting layer. The ratio of two inorganic materials refers to the relative proportions of each of the inorganic materials. The ratio can be, for example, a mass ratio, a volume ratio, a concentration ratio, a molar ratio, a surface area ratio, or an atomic ratio.

The resulting gradient adhesion-promoting layer is an improvement over homogeneous, single component layers. Additional benefits in barrier and optical properties can also be realized when combined with thin, vacuum deposited fluorinated (co)polymer layers. A multilayer gradient inorganic-(co)polymer barrier stack can be made to enhance optical properties as well as barrier properties.

As described further below, the multilayer film can be fabricated by deposition of the various layers onto the substrate, in a roll-to-roll vacuum chamber similar to the system described in U.S. Pat. No. 5,440,446 (Shaw et al.) and U.S. Pat. No. 7,018,713 (Padiyath, et al.). The deposition of the layers can be in-line, and in a single pass through the system. In some cases, the multilayer film can pass through the system several times, to form a multilayer film having several dyads.

The first and second inorganic materials can be oxides, nitrides, carbides or borides of metal or nonmetal atomic elements, or combinations of metal or nonmetal atomic elements. By "metal or nonmetal" atomic elements is meant atomic elements selected from the periodic table Groups IIA, IIIA, IVA, VA, VIA, VIIA, IB, or IIB, metals of Groups IIIB, IVB, or VB, rare-earth metals, or combinations thereof. Suitable inorganic materials include, for example, metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, aluminum nitride, silicon nitride, boron nitride, aluminum oxynitride, silicon oxynitride, boron oxynitride, zirconium oxyboride, titanium oxyboride, and combinations thereof. ITO is an example of a special class of ceramic materials that can become electrically conducting with the proper selection of the relative proportions of each elemental constituent. Silicon-aluminum oxide and indium tin oxide are presently preferred inorganic materials forming the adhesion-promoting layer 14.

For purposes of clarity, the adhesion-promoting layer 14 described in the following discussion is directed toward a composition of oxides; however, it is to be understood that the composition can include any of the oxides, nitrides, carbides, borides, oxynitrides, oxyborides and the like described above.

In one exemplary embodiment of such an adhesion-promoting layer 14, the first inorganic material is silicon oxide, and the second inorganic material is aluminum oxide. In this embodiment, the atomic ratio of silicon to aluminum changes throughout the thickness of the adhesion-promoting layer, e.g., there is more silicon than aluminum near a first surface of the adhesion-promoting layer, gradually becoming more aluminum than silicon as the distance from the first surface increases. In one embodiment, the atomic ratio of silicon to aluminum can change monotonically as the distance from the first surface increases, i.e., the ratio either increases or decreases as the distance from the first surface increases, but the ratio does not both increase and decrease as the distance from the first surface increases. In another embodiment, the ratio does not increase or decrease monotonically, i.e. the ratio can increase in a first portion, and decrease in a second portion, as the distance from the first surface increases. In this embodiment, there can be several increases and decreases in the ratio as the distance from the first surface increases, and the ratio is non-monotonic. A change in the inorganic oxide concentration from one oxide species to another throughout the thickness of the adhesion-promoting layer 14 results in improved barrier performance, as measured by water vapor transmission rate.

In addition to improved barrier properties, the gradient composition can be made to exhibit other unique optical properties while retaining improved barrier properties. The gradient change in composition of the layer produces corresponding change in refractive index through the layer. The materials can be chosen such that the refractive index can change from high to low, or vice versa. For example, going from a high refractive index to a low refractive index can allow light traveling in one direction to easily pass through the layer, while light travelling in the opposite direction may be reflected by the layer.

The refractive index change can be used to design layers to enhance light extraction from a light emitting device being protected by the layer. The refractive index change can instead be used to pass light through the layer and into a light harvesting device such as a solar cell. Other optical constructions, such as band pass filters, can also be incorporated into the layer while retaining improved barrier properties.

In order to promote silane bonding to the oxide surface, it is desirable to form hydroxyl silanol (Si—OH) groups on a freshly sputter deposited silicon dioxide ($SiO_2$) layer. The amount of water vapor present in a multi-process vacuum chamber can be controlled sufficiently to promote the formation of Si—OH groups in high enough surface concentration to provide increased bonding sites. With residual gas monitoring and the use of water vapor sources the amount of water vapor in a vacuum chamber can be controlled to ensure adequate generation of Si—OH groups.

Articles Including a Multilayer Film Including a Fluorinated (Co)Polymer Layer

In a further aspect, the disclosure describes an article comprising a multilayer film according to any of the foregoing embodiments, wherein the article is selected from a photovoltaic device, a display device, a solid-state lighting device, a sensor, a medical or biological diagnostic device, an electrochromic device, light control device, or a combination thereof.

Processes for Making Multilayer Films

In still other exemplary embodiments, the disclosure describes various processes for making a multilayer film including at least one of the foregoing fluorinated (co) polymer layers using a fluorinated (co)polymer formed by reaction (e.g., free radical polymerization) of at least one of the foregoing polymerizable compositions including at least one of the foregoing fluorinated photoinitiators, overlaying a substrate. The processes comprises forming a (co)polymer layer overlaying a major surface of any of the foregoing substrates.

Thus, in exemplary embodiments, the disclosure describes a process for making a multilayer film, comprising forming at least one (co)polymer layer overlaying a substrate, wherein the (co)polymer layer is the reaction product of any of the foregoing polymerizable compositions including one of the foregoing fluorinated photoinitiators, and applying at least one adhesion-promoting layer overlaying the substrate. In some such embodiments, the adhesion-promoting layer comprises an inorganic oxide, nitride, oxynitride, oxycarbide, hydroxylated (co)polymer, or a combination thereof.

In some exemplary embodiments, forming the (co)polymer layer further comprises evaporating the polymerizable composition, condensing the evaporated polymerizable composition or the (co)polymer as a layer overlaying the substrate, and reacting the polymerizable composition in the layer to form the (co)polymer. In some such embodiments, the polymerizable composition is comprised of the fluorinated photoinitiator in an amount of at least 0.1, 0.5, 1.0, 1.5, 2.0, 2.5, 3.0, 3.5, or 4.0 wt. % based on the weight of the polymerizable composition.

In some of the foregoing embodiments, applying the adhesion-promoting layer comprises depositing onto the substrate at least one of a metal oxide, metal oxide precursor, metal nitride, metal nitride precursor, metal oxynitride, metal oxynitride precursor, oxycarbide, carbon oxide precursor, hydroxylated (co)polymer, or hydroxylated (co)polymer precursor. In certain such exemplary embodiments, depositing is achieved using sputter deposition, reactive sputtering, thermal evaporation, electron-beam evaporation, chemical vapor deposition, plasma-assisted chemical vapor deposition, atomic layer deposition, plasma-assisted atomic layer deposition, or a combination thereof.

In further exemplary embodiments, the process further comprises sequentially repeating the forming and applying steps to produce a plurality of dyads, each dyad comprised of an adhesion-promoting layer overlaying the substrate and comprising an inorganic oxide, nitride, oxynitride, oxycarbide, (co)polymer, or a combination thereof, and an adjoining (co)polymer layer overlaying the substrate and comprising a (co)polymer.

In certain such exemplary embodiments, evaporating the polymerizable composition further comprises at least one of co-evaporating the fluorinated photoinitiator and the at least one free-radically polymerizable monomer, oligomer, or mixture thereof from a liquid mixture, or sequentially evaporating the fluorinated photoinitiator and the at least one free-radically polymerizable monomer, oligomer, or mixture thereof from separate liquid sources.

In some such embodiments, the polymerizable composition is comprised of the fluorinated photoinitiator in an amount of no more than about 10.0, 7.5, 5.0, 4.0 or 3.0 wt. % based on the weight of the polymerizable composition.

In additional such exemplary embodiments, the polymerizable composition further comprises at least one of co-condensing the fluorinated photoinitiator with the at least one free-radically polymerizable monomer, oligomer, or mixture thereof as the layer overlaying the substrate, or sequentially condensing the fluorinated photoinitiator and the at least one free-radically polymerizable monomer, oligomer, or mixture thereof as the layer overlaying the substrate.

In some such exemplary embodiments, reacting the fluorinated photoinitiator with at least one free-radically polymerizable monomer, oligomer, or mixture thereof occurs at least in part in the layer overlaying the substrate, optionally wherein the reacting of the fluorinated photoinitiator with at least one free-radically polymerizable monomer, oligomer, or mixture thereof comprises crosslinking initiated by application of heat, actinic radiation, electron beam radiation, gamma radiation, plasma, or a combination thereof.

In certain presently-preferred such embodiments, the adhesion-promoting layer comprises at least one of an oxide, nitride, carbide, boride or a combination thereof of atomic elements selected from Groups IIA, IIIA, IVA, IVB, VA, VB, VIA, VIIA, IB, or IIB; a metal or a combination thereof selected from Groups IIIA, IIIB, IVA, IVB, VB, VIB, VIIIB; a rare-earth metal or a combination thereof or a (meth)acrylic (co)polymer or a combination thereof, optionally wherein the oxide, nitride, carbide or boride comprises aluminum, indium, silicon, tin, titanium, zirconium, hafnium, vanadium, niobium, tantalum, cerium, strontium, or a combination thereof and the metal or metal alloy comprises aluminum, silicon, germanium, copper, silver, gold, titanium, zirconium, chromium, nickel or a combination thereof.

Formation of Fluorinated (Co)polymer Layers by Vapor Coating Processes

Vapor deposition or coating processes may be used advantageously to produce flexible and durable multilayer films useful in flexible electronic and/or optical devices.

Chemical vapor deposition methods (CVD and PECVD) generate vaporized metal or metal oxide precursors that undergo a chemical reaction when adsorbed on a substrate to form inorganic coatings. Vacuum vapor deposition processes such as thermal evaporation of solid materials (e.g., resistive heating or e-beam heating) also may be used. Sputtering also has been used to form metal adhesion-promoting layers.

Figure 2:
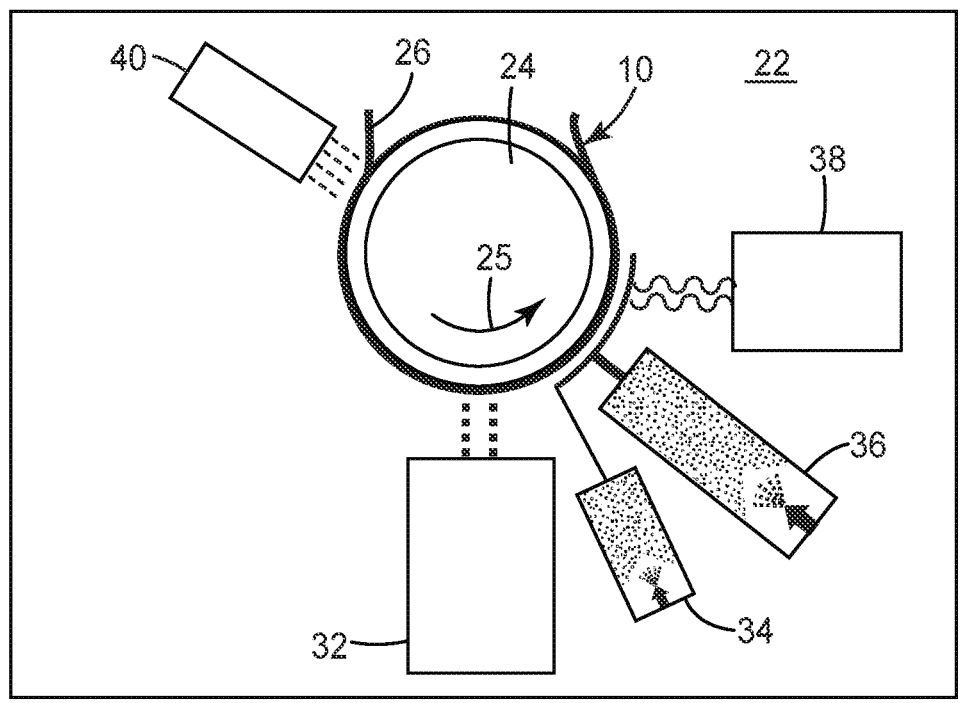
FIG. 2 is a diagram illustrating an exemplary process for making a multilayer film including at least one layer formed using a fluorinated photoinitiator according to an exemplary embodiment of the present disclosure.

Turning again to the drawings, FIG. 2 is a diagram of a system 22, illustrating an exemplary vapor coating process for making multilayer film 10. System 22 is contained within an inert environment and includes a chilled drum 24 for receiving and moving the substrate 12 (FIG. 1), as represented by a film 26, thereby providing a moving web on which to form the layers. Preferably, an optional plasma treatment unit 40 may be used to plasma treat or prime film 26 in order to improve adhesion of the adhesion-promoting layer at 14 (FIG. 1) to substrate 12 (FIG. 1). An oxide sputter unit 32 applies an oxide to form layer 14 (FIG. 1) as drum 24 advances film 26. An evaporator 36 applies an at least one fluorinated (co)polymer layer precursor, which is cured by curing unit 38 to form at least one fluorinated (co)polymer layer 16 (FIG. 1) as drum 24 advances the film 26 in a direction shown by arrow 25.

For additional alternating adhesion-promoting layers 18 and fluorinated (co)polymer layers 20, drum 24 can rotate in a reverse direction opposite arrow 25 and then advance film 26 again to apply the additional alternating adhesion-promoting layer and at least one fluorinated (co)polymer layer, and that sub-process can be repeated for as many alternating layers as desired or needed In certain presently preferred embodiments, reacting the (meth)acryloyl compound with the (meth)acryl-silane compound to form a fluorinated (co)polymer layer 16 on the adhesion-promoting layer 14 occurs at least in part on the adhesion-promoting layer 14.

Optional evaporator 34 may be used additionally to provide other co-reactants or co-monomers (e.g. additional (meth)acryloyl compounds) which may be useful in forming the fluorinated (co)polymer layer 16 (FIG. 1). For additional alternating adhesion-promoting layers 14 and fluorinated (co)polymer layers 16, drum 24 can rotate in a reverse direction opposite arrow 25 and then advance film 26 again to apply the additional alternating adhesion-promoting layers 14 and fluorinated (co)polymer layers 16, and that sub-process can be repeated for as many alternating layers or dyads as desired or needed.

The adhesion-promoting layer 14 can be formed using techniques employed in the film metalizing art such as sputtering (e.g., cathode or planar magnetron sputtering), evaporation (e.g., resistive or electron beam evaporation), chemical vapor deposition, plasma enhanced chemical vapor deposition, atomic layer deposition, monomer evaporation and cure, initiated chemical vapor deposition, plasma polymerization, molecular layer deposition, plating and the like. In one aspect, the adhesion-promoting layer 14 is formed using sputtering, e.g., reactive sputtering. Enhanced barrier properties have been observed when the adhesion-promoting layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy as occurs in sputtering, leading to a lower void fraction as a result of compaction.

In some exemplary embodiments, a sputter deposition process can use dual targets powered by an alternating current (AC) power supply in the presence of a gaseous atmosphere having inert and reactive gasses, for example argon and oxygen, respectively. The AC power supply alternates the polarity to each of the dual targets such that for half of the AC cycle one target is the cathode and the other target is the anode. On the next cycle the polarity switches between the dual targets. This switching occurs at a set frequency, for example about 40 kHz, although other frequencies can be used. Oxygen that is introduced into the process forms adhesion-promoting layers on both the substrate receiving the inorganic composition, and also on the surface of the target. The dielectric oxides can become charged during sputtering, thereby disrupting the sputter deposition process. Polarity switching can neutralize the surface material being sputtered from the targets, and can provide uniformity and better control of the deposited material.

In further exemplary embodiments, each of the targets used for dual AC sputtering can include a single metal or nonmetal element, or a mixture of metal and/or nonmetal elements. A first portion of the adhesion-promoting layer closest to the moving substrate is deposited using the first set of sputtering targets. The substrate then moves proximate the second set of sputtering targets and a second portion of the adhesion-promoting layer is deposited on top of the first portion using the second set of sputtering targets. The composition of the adhesion-promoting layer changes in the thickness direction through the layer.

In additional exemplary embodiments, the sputter deposition process can use targets powered by direct current (DC) power supplies in the presence of a gaseous atmosphere having inert and reactive gasses, for example argon and oxygen, respectively. The DC power supplies supply power (e.g. pulsed power) to each cathode target independent of the other power supplies. In this aspect, each individual cathode target and the corresponding material can be sputtered at differing levels of power, providing additional control of composition through the layer thickness. The pulsing aspect of the DC power supplies is similar to the frequency aspect in AC sputtering, allowing control of high rate sputtering in the presence of reactive gas species such as oxygen. Pulsing DC power supplies allow control of polarity switching, can neutralize the surface material being sputtered from the targets, and can provide uniformity and better control of the deposited material.

In one particular exemplary embodiment, improved control during sputtering can be achieved by using a mixture, or atomic composition, of elements in each target, for example a target may include a mixture of aluminum and silicon. In another embodiment, the relative proportions of the elements in each of the targets can be different, to readily provide for a varying atomic ratio throughout the adhesion-promoting layer. In one embodiment, for example, a first set of dual AC sputtering targets may include a 90/10 mixture of silicon and aluminum, and a second set of dual AC sputtering targets may include a 75/25 mixture of aluminum and silicon. In this embodiment, a first portion of the adhesion-promoting layer can be deposited with the 90% Si/10% Al target, and a second portion can be deposited with the 75% Al/25% Si target. The resulting adhesion-promoting layer has a gradient composition that changes from about 90% Si to about 25% Si (and conversely from about 10% Al to about 75% Al) through the thickness of the adhesion-promoting layer.

In typical dual AC sputtering, homogeneous adhesion-promoting layers are formed, and barrier performance from these homogeneous adhesion-promoting layers suffer due to defects in the layer at the micro and nano-scale. One cause of these small scale defects is inherently due to the way the oxide grows into grain boundary structures, which then propagate through the thickness of the film. Without being bound by theory, it is believed several effects contribute to the improved barrier properties of the gradient composition barriers described herein. One effect can be that greater densification of the mixed oxides occurs in the gradient region, and any paths that water vapor could take through the oxide are blocked by this densification. Another effect can be that by varying the composition of the oxide materials, grain boundary formation can be disrupted resulting in a microstructure of the film that also varies through the thickness of the adhesion-promoting layer. Another effect can be that the concentration of one oxide gradually decreases as the other oxide concentration increases through the thickness, reducing the probability of forming small-scale defect sites. The reduction of defect sites can result in a coating having reduced transmission rates of water permeation.

A fluorinated coupling agent can be deposited as an additional adhesion-promoting layer (not shown in FIG. 1) on adhesion-promoting layer 14 (FIG. 1) using optional evaporator 34 immediately before depositing fluorinated monomer from evaporator 38 onto the fluorinated coupling agent layer and, as roller/drum 24 advances the film, both layers (fluorinated coupling agent and fluorinated monomer are cured together by curing unit 38 to form fluorinated (co)polymer layer 16. Depositing the (meth)acryl-silane and the (meth)acryloyl compound can involve sequentially evaporating the (meth)acryloyl compound and the (meth)acryl-silane compound from separate sources, or co-evaporating a mixture of the (meth)acryloyl compound and the (meth)acryl-silane compound. The adhesion-promoting layers can be subjected to post-treatments such as heat treatment, ultraviolet (UV) or vacuum UV (VUV) treatment, or plasma treatment. Heat treatment can be conducted by passing the film through an oven or directly heating the film in the coating apparatus, e.g., using infrared heaters or heating directly on a drum. Heat treatment may for example be performed at temperatures from about 30° C. to about 200° C., about 35° C. to about 150° C., or about 40° C. to about 70° C.

Other functional layers or coatings that can be added to the inorganic or hybrid film include an optional layer or layers to make the film more rigid. The uppermost layer of the film is optionally a suitable protective layer, such as optional inorganic layer 20. If desired, the protective layer can be applied using conventional coating methods such as roll coating (e.g., gravure roll coating) or spray coating (e.g., electrostatic spray coating), then crosslinked using, for example, UV radiation. The protective layer can also be formed by flash evaporation, vapor deposition and cross-linking of a monomer as described above. Volatilizable (meth)acrylate monomers are suitable for use in such a protective layer. In a specific embodiment, volatilizable (meth)acrylate monomers are employed.

Methods of Using Multilayer Films

In a further aspect, the disclosure describes methods of using a multilayer film made as described above in an article selected from a photovoltaic device, a display device, a solid state lighting device, a sensor, a medical or biological diagnostic device, an electrochromic device, light control device, and combinations thereof. Presently preferred articles incorporating such multilayer films include flexible thin film (e.g. copper indium gallium diselenide, CIGS) and organic photovoltaic solar cells, and organic light emitting diodes (OLED) used in displays and solid state lighting. Currently these applications are generally limited to non-flexible glass substrates used as vapor barriers.

Exemplary embodiments of the present disclosure provide multilayer films which exhibit improved moisture resistance when used in moisture barrier applications. In some exemplary embodiments, the multilayer film can be deposited directly on a substrate that includes an electronic or optical device, a process often referred to as direct encapsulation. The electronic or optical device can be, for example, an organic, inorganic, or hybrid organic/inorganic semiconductor device including, for example, a photovoltaic device such as a CIGS; a display device such as an OLED, electrochromic, or an electrophoretic display; an OLED or other electroluminescent solid state lighting device, or others. Flexible electronic devices can be encapsulated directly with the gradient composition adhesion-promoting layer. For example, the devices can be attached to a flexible carrier substrate, and a mask can be deposited to protect electrical connections from the adhesion-promoting layer deposition. A at least one fluorinated (co)polymer layer and the adhesion-promoting layer can be deposited as described above, and the mask can then be removed, exposing the electrical connections.

Exemplary embodiments of the disclosed methods can enable the formation of multilayer films that exhibit superior mechanical properties such as elasticity and flexibility yet still have low oxygen or water vapor transmission rates. The films have at least one inorganic or hybrid organic/adhesion-promoting layer or can have additional inorganic or hybrid organic/adhesion-promoting layers. In one embodiment, the disclosed films can have inorganic or hybrid layers alternating with organic compound, e.g., (co)polymer layers. In another embodiment, the films can have a film that includes an inorganic or hybrid material and an organic compound.

Exemplary embodiments of multilayer films according to the present disclosure are preferably transmissive to actinic radiation (e.g., ultraviolet, visible and/or infrared light). The term "transmissive to visible and infrared light" as used herein can mean having an average transmission over the visible and infrared portion of the spectrum of at least about 75% (in some embodiments at least about 80, 85, 90, 92, 95, 97, or 98%) measured along the normal axis. In some embodiments, the visible and infrared light-transmissive assembly has an average transmission over a range of 400 nm to 1400 nm of at least about 75% (in some embodiments at least about 80, 85, 90, 92, 95, 97, or 98%). Visible and infrared light-transmissive assemblies are those that do not interfere with absorption of visible and infrared light, for example, by photovoltaic cells.

In some exemplary embodiments, the visible and infrared light-transmissive assembly has an average transmission over a range of wavelengths of light that are useful to a photovoltaic cell of at least about 75% (in some embodiments at least about 80, 85, 90, 92, 95, 97, or 98%). The first and second polymeric film substrates, pressure sensitive adhesive layer, and multilayer film can be selected based on refractive index and thickness to enhance transmission to visible and infrared light. Suitable methods for selecting the refractive index and/or thickness to enhance transmission to visible and/or infrared light are described in copending PCT International Publication Nos. WO 2012/003416 and WO 2012/003417.

Exemplary multilayer films according to the present disclosure are typically flexible. The term "flexible" as used herein refers to being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the flexible assembly can be bent around a radius of curvature of at least 0.635 cm (¼ inch), 1.3 cm (½ inch) or 1.9 cm (¾ inch).

Exemplary multilayer films according to the present disclosure generally do not exhibit delamination or curl that can arise from thermal stresses or shrinkage in a multilayer structure. Herein, curl is measured using a curl gauge described in "Measurement of Web Curl" by Ronald P. Swanson presented in the 2006 AWEB conference proceedings (Association of Industrial Metallizers, Coaters and Laminators, Applied Web Handling Conference Proceedings, 2006). According to this method curl can be measured to the resolution of 0.25 m$^{-1}$ curvature. In some embodiments, multilayer films according to the present disclosure exhibit curls of up to 7, 6, 5, 4, or 3 m$^{-1}$. From solid mechanics, the curvature of a beam is known to be proportional to the bending moment applied to it. The magnitude of bending stress is in turn is known to be proportional to the bending moment. From these relations the curl of a sample can be used to compare the residual stress in relative terms. Barrier films also typically exhibit high peel adhesion to EVA, and other common encapsulants for photovoltaics, cured on a substrate. The properties of the multilayer films disclosed herein typically are maintained even after high temperature and humidity aging.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

All parts, percentages, and ratios in the examples are by weight, unless noted otherwise. Solvents and other reagents used were obtained from Sigma-Aldrich Chemical Company; Milwaukee, WI unless specified differently.

Materials

Table 1 lists the materials used to prepare fluorinated photoinitiators according to the foregoing disclosure:

TABLE 1

Materials Used in the Examples

| Short Name | Long Name | CAS Number | Source |
|---|---|---|---|
| Dimethyl Phenylphosphonite | Dimethoxyphenylphosphine | 2946-64-4 | Alfa Aesar |
| Pentafluorobenzoyl chloride | 2,3,4,5,6-Pentafluorobenzoyl chloride | 2251-50-5 | Oakwood Chemicals |
| Bis-Trifluoromethylbenzoyl Chloride | 3,5-Bis(trifluoromethyl) benzoyl chloride | 785-56-8 | Oakwood Chemicals |

Synthetic Procedures:

Example 1

Pentafluorobenzoyl MethoxyPhenylPhosphine Oxide

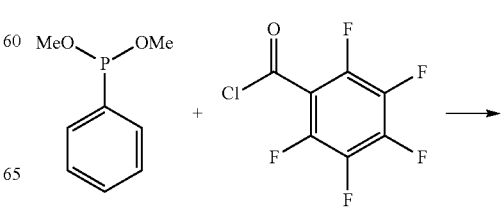

-continued

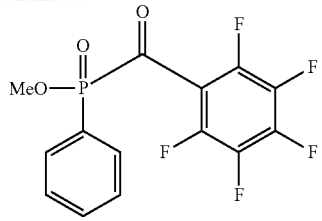

Pentafluorobenzoyl methoxyphenylphosphine oxide was synthesized under yellow ambient light under vacuum in a flame-dried 3-neck roundbottom flask fitted with thermocouple, magnetic stir bar, and liquid addition funnel. The roundbottom flask was back-filled with dry nitrogen and charged with 9.92 g (58.3 mmol) dimethoxyphenylphosphine.

The liquid addition funnel was charged with 13.44 g (58.3 mmol) pentafluorobenzoyl chloride, and the reaction apparatus was connected to vacuum. The roundbottom flask was cooled with a dry ice/isopropanol bath and the pentafluorobenzoyl chloride was added dropwise at a rate sufficient to keep the reaction temperature under 15° C. During this time the reaction mixture became a bright yellowish-orange pourable-viscosity oil. Pentafluorobenzoyl methoxyphenylphosphine oxide was collected in quantitative yield and stored in a brown glass jar. H-NMR confirmed reaction product.

Example 2

Bis-Trifluoromethylbenzoyl MethoxyPhenylPhosphine Oxide

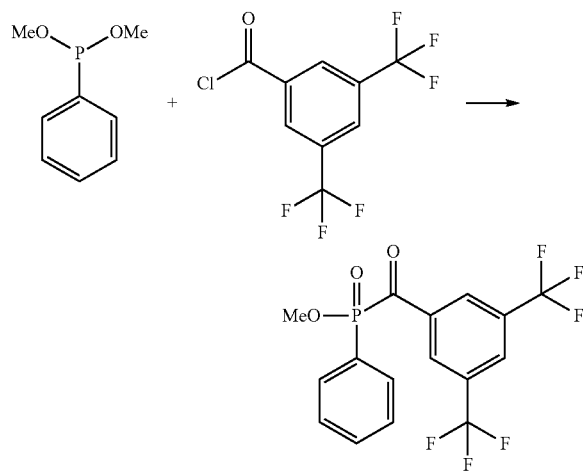

Bis-trifluoromethylbenzoyl methoxyphenylphosphine oxide was synthesized under yellow ambient light under vacuum in a flame-dried 3-neck roundbottom flask fitted with thermocouple, magnetic stir bar, and liquid addition funnel. The roundbottom flask was back-filled with dry nitrogen and charged with 9.54 g (56.1 mmol) dimethoxyphenylphosphine. The liquid addition funnel was charged with 15.51 g (56.1 mmol) bis-trifluoromethylbenzoyl chloride, and the reaction apparatus was connected to vacuum. The roundbottom flask was cooled with a dry ice/water bath and the trifluoromethylbenzoyl chloride was added dropwise at a rate sufficient to keep the reaction temperature under 15° C. During this time the reaction mixture became a light yellow and very sticky oil which inhibited continual magnetic stirring as the reaction progressed. Bis-trifluoromethylbenzoyl methoxyphenylphosphine oxide was collected in quantitative yield and stored in a brown glass jar. H-NMR confirmed reaction product.

Ultraviolet-Visible (UV-VIS) Light Spectroscopy

Figure 3:
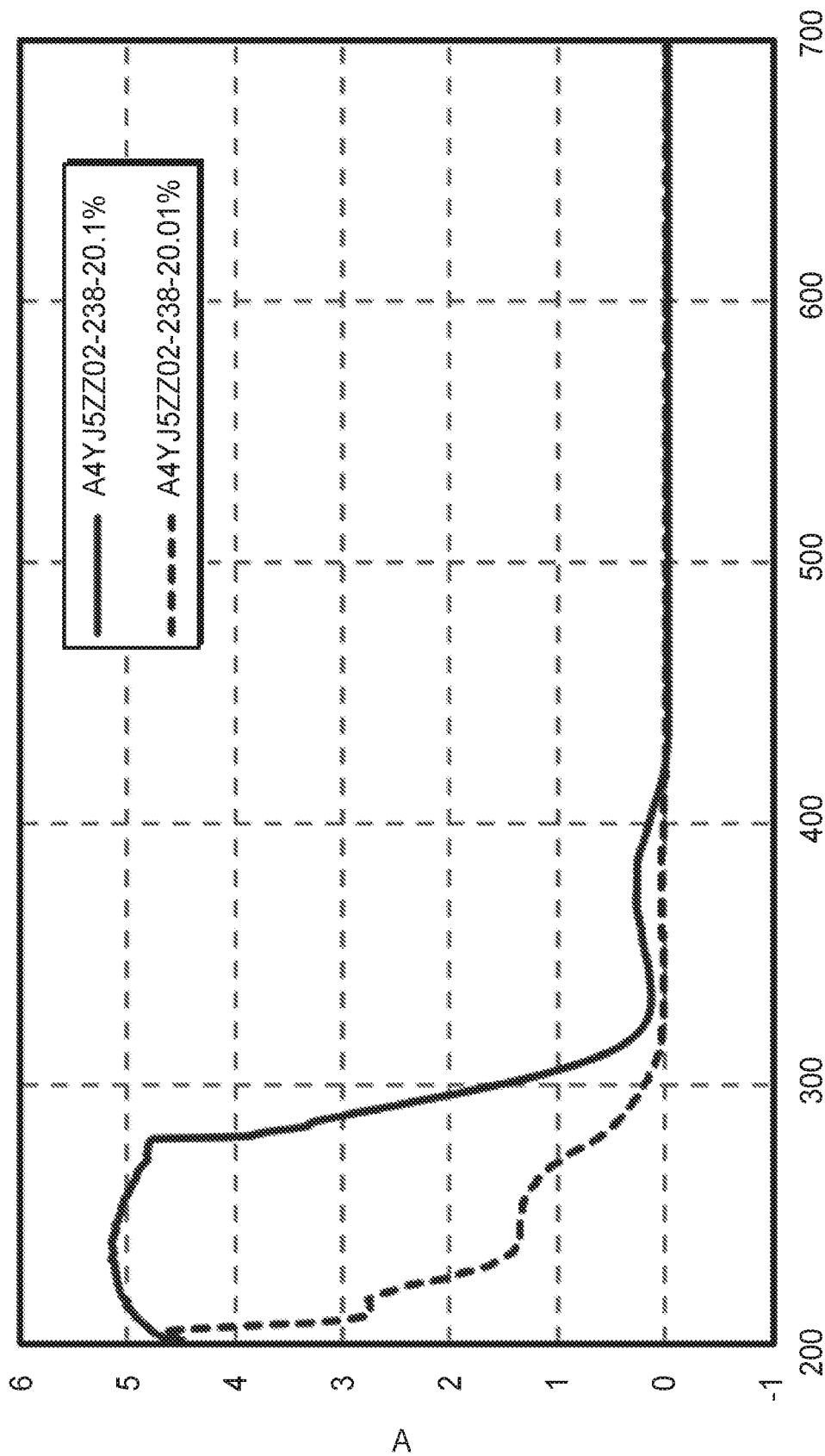
FIG. 3 is a UV-VIS spectrum of an exemplary fluorinated photoinitiator according to an embodiment of the present disclosure.
Figure 4:
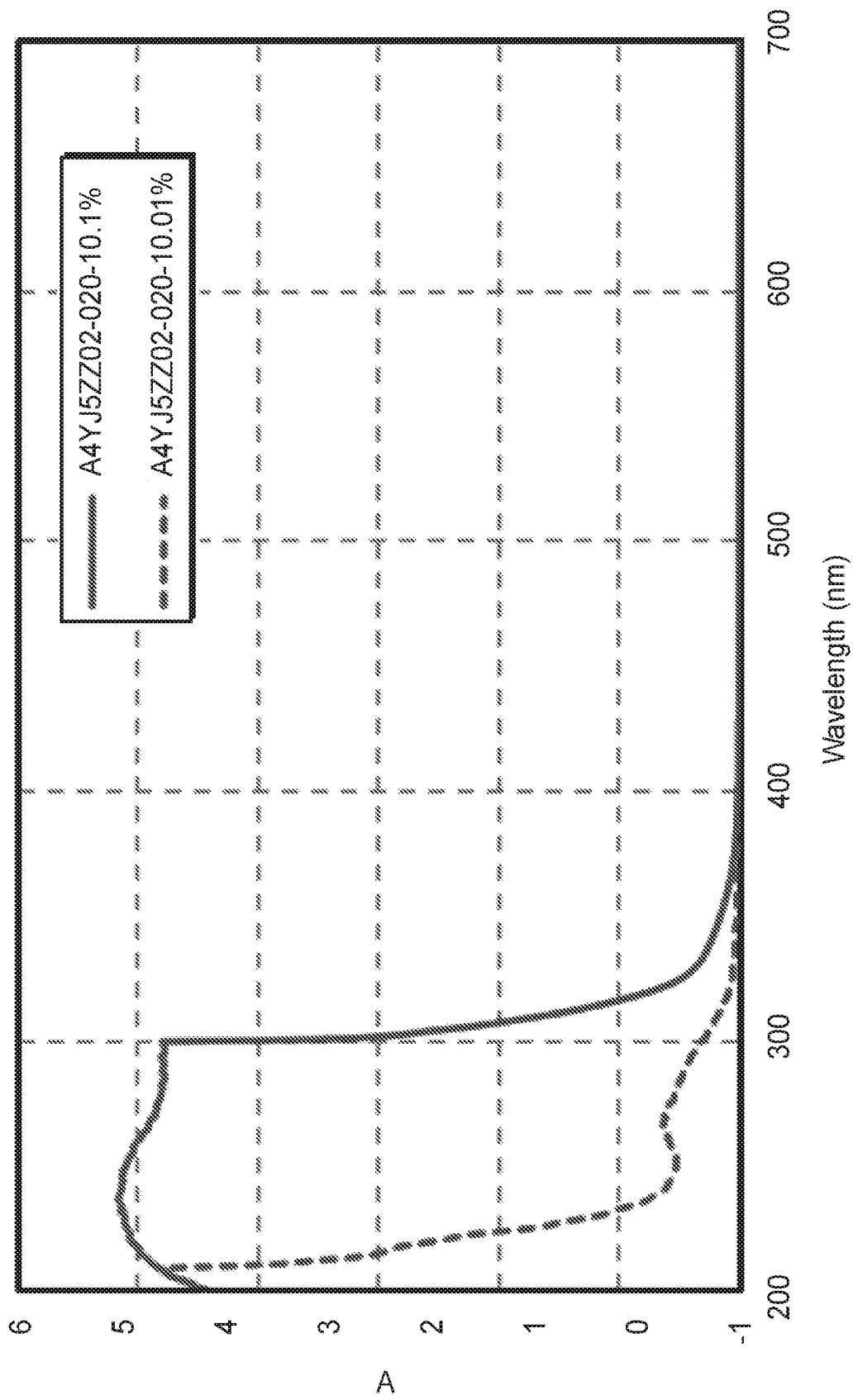
FIG. 4 is a UV-VIS spectrum of an exemplary fluorinated photoinitiator according to another embodiment of the present disclosure.
Figure 5:
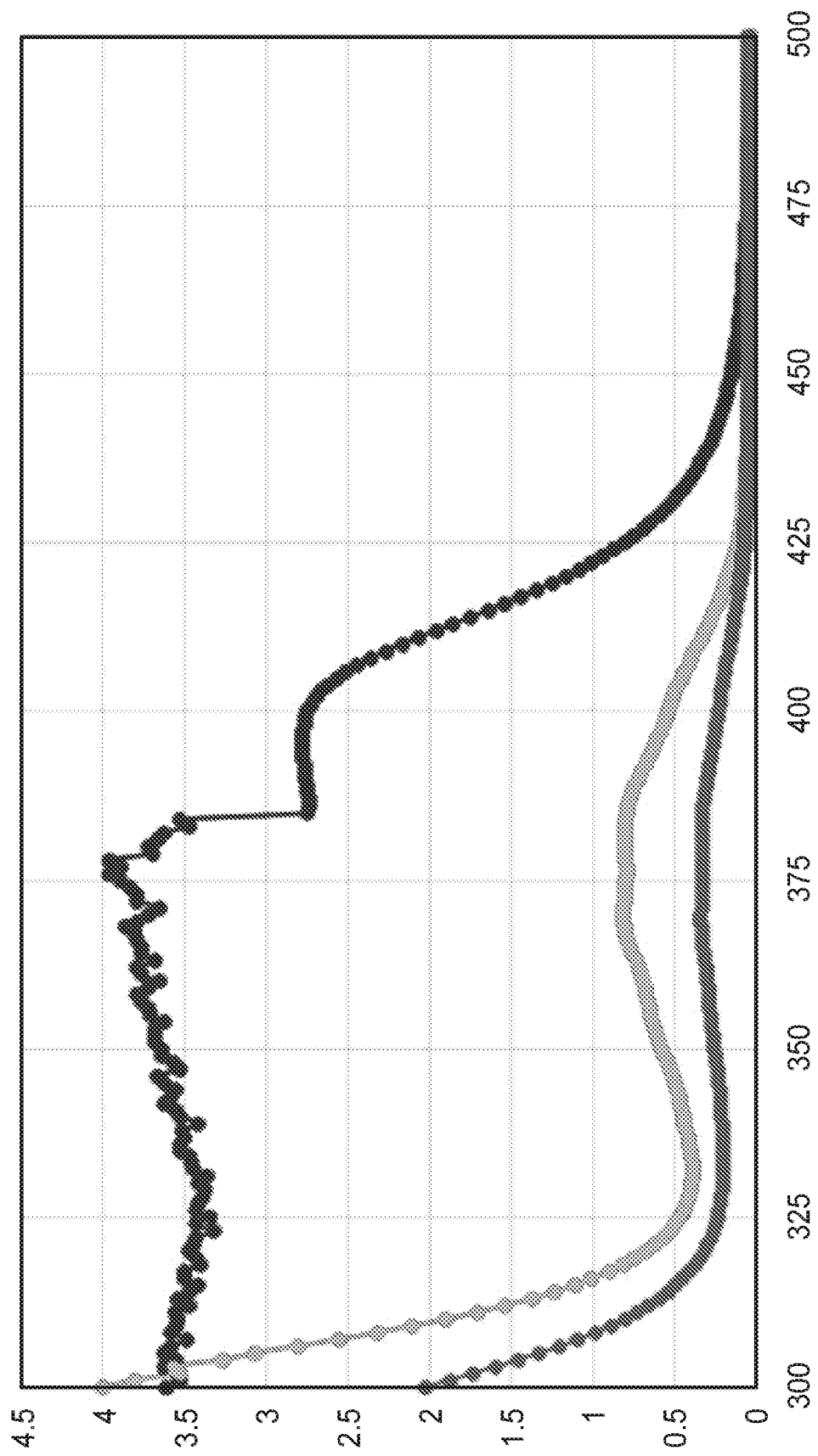
FIG. 5 is a UV-VIS spectrum of an exemplary fluorinated photoinitiator according to yet another embodiment of the present disclosure.

UV-VIS spectra were collected for the fluorinated photoinitiators of Examples 1 and 2 using a PerkinElmer LAMBDA 365 UV/Vis spectrophotometer, at 0.1 and 0.01 w/w % in acetonitrile versus an acetonitrile reference. These photoinitiators have strong UV absorption properties, and their absorption spectra tail into the visible (violet-blue) region of the spectrum, especially at higher concentrations, as shown in FIGS. 3-5.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

The invention claimed is:
1. A fluorinated photoinitiator having the formula:

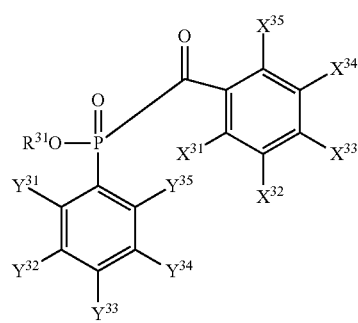

wherein:
$X^{31}, X^{32}, X^{33}, X^{34}, X^{35}$ are each independently selected from —H, —F, or —CF$_3$, with the proviso that at least 3 of $X^{31}, X^{32}, X^{33}, X^{34}, X^{35}$ are —F, or that at least 1 of $X^{31}, X^{32}, X^{33}, X^{34}, X^{35}$ is —CF$_3$;
$Y^{31}, Y^{32}, Y^{33}, Y^{34}, Y^{35}$ are each independently selected from —H, or CH$_3$; and
$R^{31}$ is an alkyl group of 1 to 4 carbon atoms.

2. A polymerizable composition comprising:
the fluorinated photoinitiator of claim 1; and
at least one free-radically polymerizable monomer, oligomer, or mixture thereof,
optionally wherein the polymerizable composition is comprised of the fluorinated photoinitiator in an amount of at least 0.1 wt. % based on the weight of the polymerizable composition.

3. The polymerizable composition of claim 2, wherein the free-radically polymerizable monomer, oligomer, or combination thereof is fluorinated.

4. The polymerizable composition of claim 2, wherein the free-radically polymerizable monomer, oligomer, or combination thereof has a fluorine content of at least 25 wt. %.

5. The polymerizable composition of claim 2, wherein the polymerizable composition is comprised of a fluorinated oligomer including a perfluorooxyalkylene group.

6. The polymerizable composition of claim 2, wherein the fluorinated photoinitiator has a fluorine content of at least 10 wt. %.

7. The polymerizable composition of claim 2, further comprising at least one of a (meth)acrylic monomer or oligomer, optionally wherein the at least one (meth)acrylic monomer or oligomer comprises HFPO oligomer diacrylate of the structure CH$_2$=CHC(O)O—H$_2$C—(CF$_3$)CF—[OCF$_2$(CF$_3$)CF]$_s$—O(CF$_2$)$_u$O—[CF(CF$_3$)CF$_2$O]$_t$—CF(CF$_3$)—CH$_2$—OC(O)CH=CH$_2$, wherein u is from 2 to 6 and s and t are independently integers of 2 to 25.

8. A multilayer film comprising:
a substrate;
at least a first layer overlaying a surface of the substrate, wherein the first layer comprises a (co) polymer obtained by polymerizing the polymerizable composition of claim 2.

9. The multilayer film of claim 8, wherein the free-radically polymerizable monomer, oligomer, or combination thereof is fluorinated.

10. The multilayer film of claim 8, wherein the free-radically polymerizable monomer, oligomer, or combination thereof has a fluorine content of at least 25 wt. %.

11. The multilayer film of claim 8, wherein the polymerizable composition is comprised of the fluorinated photoinitiator in an amount of at least 0.1 wt. % based on the weight of the polymerizable composition.

12. The multilayer film of claim 11, wherein the polymerizable composition is comprised of the fluorinated photoinitiator in an amount of no more than about 10.0 wt. % based on the weight of the polymerizable composition.

13. The multilayer film of claim 8, wherein the fluorinated photoinitiator has a fluorine content of at least 10 wt. %.

14. The multilayer film of claim 8, further comprising at least one additional layer adjoining the first layer.

15. The multilayer film of claim 8, wherein the substrate comprises a flexible transparent polymeric film, optionally wherein the substrate comprises polyethylene terephthalate (PET), polyethylene terephthalate glycol (PETg), polyethylene napthalate (PEN), heat stabilized PET, heat stabilized PEN, polyoxymethylene, polyvinylnaphthalene, polyetheretherketone, a fluoropolymer, polycarbonate, polymethylmeth(meth)acrylate, poly α-methyl styrene, polysulfone, polyphenylene oxide, polyetherimide, polyethersulfone, polyamideimide, polyimide, polyphthalamide, cyclic olefin polymer (COP), cyclic olefin copolymer (COC), triacetate cellulose (TAC), or combinations thereof.

16. The multilayer film of claim 8, wherein the adhesion-promoting layer comprises at least one of an oxide, nitride, carbide, boride or a combination thereof of atomic elements selected from Groups IIA, IIIA, IVA, IVB, VA, VB, VIA, VIIA, IB, or IIB; a metal or a combination thereof selected from Groups IIIA, IIIB, IVA, IVB, VB, VIB, VIIIB; a rare-earth metal or a combination thereof; or a (meth)acrylic (co)polymer or a combination thereof, optionally wherein the oxide, nitride, carbide or boride comprises aluminum, indium, silicon, tin, titanium, zirconium, hafnium, vanadium, niobium, tantalum, cerium, strontium or a combination thereof; and the metal or metal alloy comprises aluminum, silicon, germanium, copper, silver, gold, titanium, zirconium, chromium, nickel or a combination thereof.

17. An article incorporating the multilayer film according to claim 8, wherein the article is selected from a photovoltaic device, a display device, a solid-state lighting device, a sensor, a medical or biological diagnostic device, an electrochromic device, light control device, or a combination thereof.

18. A process for making a multilayer film, comprising:
forming at least one (co) polymer layer overlaying a major surface of a substrate, wherein the (co)polymer layer is the reaction product of the polymerizable composition of claim 2, optionally wherein the polymerizable composition is comprised of the fluorinated photoinitiator in an amount of at least 0.1 wt. % based on the weight of the polymerizable composition; and
applying at least one adhesion-promoting layer overlaying the major surface of the substrate.

19. The process of claim 18, wherein forming the at least one (co) polymer layer further comprises:
evaporating the polymerizable composition;
condensing the evaporated polymerizable composition as a layer overlaying the substrate; and
reacting the polymerizable composition in the layer to form the (co) polymer.

20. The process of claim 18, wherein reacting the fluorinated photoinitiator with the at least one free-radically polymerizable monomer, oligomer, or mixture thereof occurs at least in part in the layer overlaying the substrate, optionally wherein the reacting of the fluorinated photoinitiator with the at least one free-radically polymerizable monomer, oligomer, or mixture thereof comprises crosslinking by application of heat, actinic radiation, electron beam radiation, gamma radiation, plasma radiation or a combination thereof.

* * * * *